(12) United States Patent
Ito et al.

(10) Patent No.: US 10,136,521 B2
(45) Date of Patent: *Nov. 20, 2018

(54) WIRING BOARD AND METHOD FOR MANUFACTURING THE SAME

(71) Applicant: DEXERIALS CORPORATION, Tokyo (JP)

(72) Inventors: Makiya Ito, Tochigi (JP); Ryosuke Endo, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/523,764

(22) PCT Filed: Nov. 11, 2015

(86) PCT No.: PCT/JP2015/081738
§ 371 (c)(1),
(2) Date: May 2, 2017

(87) PCT Pub. No.: WO2016/080263
PCT Pub. Date: May 26, 2016

(65) Prior Publication Data
US 2017/0325335 A1    Nov. 9, 2017

(30) Foreign Application Priority Data

Nov. 21, 2014 (JP) .................................. 2014-237191

(51) Int. Cl.
*H05K 3/00* (2006.01)
*H05K 3/12* (2006.01)
(Continued)

(52) U.S. Cl.
CPC ............. *H05K 3/1208* (2013.01); *H05K 1/03* (2013.01); *H05K 1/034* (2013.01); *H05K 1/0326* (2013.01);
(Continued)

(58) Field of Classification Search
CPC ...... H05K 3/0091; H05K 3/1208; H05K 3/28; H05K 3/4673; Y10T 29/49149; Y10T 29/49158; Y10T 29/49146
See application file for complete search history.

(56) References Cited

U.S. PATENT DOCUMENTS 4,321,404 A * 3/1982 Williams ............... C08F 291/18
427/146
5,834,564 A * 11/1998 Nguyen ............ C08F 216/1416
525/326.3
(Continued)

FOREIGN PATENT DOCUMENTS

JP    2003-209339 A    7/2003
JP    2003-240916 A    8/2003
(Continued)

OTHER PUBLICATIONS

Jan. 26, 2016 International Search Report issued in Patent Application No. PCT/JP2015/081738.

*Primary Examiner* — Chau N Nguyen
*Assistant Examiner* — Roshn Varghese
(74) *Attorney, Agent, or Firm* — Oliff PLC (57) ABSTRACT

A wiring board and a method for manufacturing the same enabling simple and easy formation of a conductive pattern are provided. The method comprises a transferring step of bringing a resin composition containing a first compound inducing a low surface free energy and a second compound inducing a higher surface free energy than the first compound into contact with a master on which a desired surface free energy difference pattern is formed and curing to obtain
(Continued)

a base material to which the surface free energy difference pattern is transferred; and a conductive pattern forming step of applying a conductive coating composition onto a surface of pattern transfer of the base material to form a conductive pattern.

3 Claims, 8 Drawing Sheets (51) Int. Cl.
- *H05K 3/28* (2006.01)
- *H05K 3/46* (2006.01)
- *H05K 1/03* (2006.01)

(52) U.S. Cl.
CPC .............. *H05K 2201/015* (2013.01); *H05K 2201/0162* (2013.01); *H05K 2201/0166* (2013.01); *H05K 2201/0187* (2013.01); *H05K 2203/1173* (2013.01)

(56) References Cited

U.S. PATENT DOCUMENTS

| | | | |
|---|---|---|---|
| 2003/0091752 A1* | 5/2003 | Nealey | B82Y 30/00 427/558 |
| 2005/0112810 A1 | 5/2005 | Kobayashi | |
| 2006/0159849 A1* | 7/2006 | Morita | B82Y 10/00 427/258 |
| 2008/0061288 A1 | 3/2008 | Tomono et al. | |
| 2009/0265929 A1* | 10/2009 | Nakagawa | H01L 21/67144 29/846 |
| 2010/0316849 A1* | 12/2010 | Millward | B81C 99/009 428/195.1 |
| 2013/0069087 A1* | 3/2013 | Onodera | H05K 3/1208 257/88 |
| 2013/0260536 A1* | 10/2013 | Ulmer | B41N 1/00 438/478 |
| 2015/0252131 A1* | 9/2015 | Ito | C08K 5/435 428/195.1 |
| 2015/0337161 A1* | 11/2015 | Haraguchi | C08L 83/04 428/335 |
| 2016/0124305 A1* | 5/2016 | Ito | C03C 17/008 430/18 |
| 2017/0204285 A1* | 7/2017 | Ito | C09D 135/02 |
| 2017/0261857 A1* | 9/2017 | Ito | G03F 7/09 |

FOREIGN PATENT DOCUMENTS

| | | |
|---|---|---|
| JP | 2005-052686 A | 3/2005 |
| JP | 2007-164070 A | 6/2007 |
| JP | 2008-066567 A | 3/2008 |
| JP | 2009-071037 A | 4/2009 |
| JP | 2011-014829 A | 1/2011 |
| JP | 2011-091380 A | 5/2011 |
| JP | 2014-067566 A | 4/2014 |
| WO | 2014/199910 A1 | 12/2014 |

* cited by examiner

WIRING BOARD AND METHOD FOR MANUFACTURING THE SAME

TECHNICAL FIELD

The present invention relates to a wiring board and a method for manufacturing the same in which a surface free energy difference of a master is transferred to a base material onto which a conductive pattern is formed. This application claims priority based on Japanese Patent Application No. 2014-237191 filed on Nov. 21, 2014, the entire contents of which are hereby incorporated by reference.

BACKGROUND ART

Currently, most of the fine patterns of electronic circuits in semiconductors, displays, and other electronic products are produced by using photolithography techniques; however, there are limits on inexpensive production using photolithography techniques. Moreover, when attempting to manufacture electronic products having increased surface areas, keeping manufacturing costs down while using fabrication methods employing photolithography has been difficult.

In view of this current situation, employment of printing techniques in manufacturing electronic circuits, sensors, and other devices, these being known as "printed electronics," is being investigated. Such methods are expected to reduce amounts of chemical substances used and have attracted attention as environmentally friendly manufacturing processes. Moreover, such methods have been partially applied in printing electrodes of membrane keyboards, automotive window glass heating wires, and RFID (Radio Frequency Identification) tag antennas, among others.

Control of base material (printed side) wettability is of critical importance in printed electronics. Control of wettability is achieved by controlling surface free energy, and various methods therefor have been proposed. Among these proposals, base materials having a surface free energy difference patterning have been proposed.

For example, PLT. 1 describes a technique in which an electromagnetic wave is irradiated through a photomask to obtain a patterned base material composed of at least two regions having different surface free energies. Furthermore, PLT. 2 describes a technique in which an acrylic resin based photosensitive material to which has been added a fluororesin or silicone resin based surface migration additive, is applied, dried, and photocured to form a layer having a low critical surface tension on a surface.

However, the base material of PLT. 1 is produced by a photolithography method, thereby complicating methods for preparing the base material, and the base material of PLT. 2 has surface irregularities, thereby making selective application through only applying ink to the surface difficult.

Furthermore, PLT. 3 describes a technique in which a surface is modified with radiation or generated ozone via a mask to form a pattern with a difference in surface free energy. Furthermore, PLT. 4 describes a technique in which a low surface free energy portion is formed by partial exposure via a transparency difference of a Fresnel lens; thereafter, an unexposed portion is exposed to light in water to form a high surface free energy portion. Then, ink is applied to the created pattern and, thereafter, excess ink is removed to form the pattern. Furthermore, PLT. 5 describes a technique in which a low surface free energy portion is formed by partial exposure via a transparency difference of a Fresnel lens; thereafter, an unexposed portion is exposed to light in water to form a high surface free energy portion.

However, although a surface free energy difference is formed in the base material of PLT. 3, the surface free energy difference is small. Consequently, when ink is applied to the surface, entirely selective application is impossible and only a film thickness difference in a coated film can be formed.

Furthermore, although a surface free energy difference is formed in the base material of PLT. 4, as in PLT. 3, selective application through simply applying ink on the surface is impossible, and processes are required for peeling the ink from a portion (low surface free energy portion) where ink deposition is undesired.

Furthermore, although a pattern is formed by transferring a functional ink layer to a surface free energy pattern, PLT. 5 includes processes requiring heat and pressure application at the time of transferring in addition to a process for peeling away excess material.

CITATION LIST

Patent Literature

PLT: 1 Japanese Unexamined Patent Application Publication No. 2011-91380

PLT: 2 Japanese Unexamined Patent Application Publication No. 2007-164070

PLT: 3 Japanese Unexamined Patent Application Publication No. 2005-52686

PLT: 4 Japanese Unexamined Patent Application Publication No. 2003-240916

PLT: 5 Japanese Unexamined Patent Application Publication No. 2011-14829

SUMMARY OF THE INVENTION

Technical Problem

In view of such conventional circumstances, the present invention provides a wiring board and a method for manufacturing the same in which a conductive pattern can be simply and easily formed.

Solution to Problem

In order to solve the above-mentioned problems, a method for manufacturing a wiring board according to the present disclosure comprises: a transferring step of bringing a resin composition containing a first compound inducing a low surface free energy and a second compound inducing a high surface free energy which is higher than the first compound into contact with a master on which a desired surface free energy difference pattern is formed and curing to obtain a base material to which the surface free energy difference pattern is transferred; and a conductive pattern forming step of applying a conductive coating composition onto a surface of pattern transfer of the base material to form a conductive pattern, Moreover, a wiring board according to the present disclosure comprises: a base material having a pattern of a high surface free energy region and a low surface free energy region; and a conductive pattern formed on the high surface free energy region.

Advantageous Effects of Invention

According to the present disclosure, by using a base material having a surface free energy difference pattern on a surface thereof, it is possible to simply and easily form a conductive pattern by applying a conductive coating composition.

DESCRIPTION OF EMBODIMENTS

Embodiments of the present invention will now be more particularly described according to the following order with reference to the accompanying drawings.
1. Method for Manufacturing Wiring Board
2. Wiring board
3. Examples
1. Method For Manufacturing Wiring Board A method for manufacturing a wiring board according to one embodiment of the present disclosure comprises: a transferring step of bringing a resin composition containing a first compound inducing a low surface free energy and a second compound inducing a high surface free energy which is higher than the first compound into contact with a master on which a desired surface free energy difference pattern is formed and curing to obtain a base material to which the surface free energy difference pattern is transferred; and a conductive pattern forming step of applying a conductive coating composition onto a surface of pattern transfer of the base material to form a conductive pattern.

Transferring Step

In a transferring step, first, a resin composition containing a first compound inducing a low surface free energy and a second compound inducing a surface free energy higher than the first compound is prepared, Examples of the resin composition include acrylic resin and epoxy resin, among others; among these, a photocurable acrylic resin composition having a fast curing reaction can be favorably used. Hereinafter, a photocurable acrylic resin composition containing the first compound, the second compound, and a photoinitiator will be described as an example.

As the first compound, it is possible to use surface conditioner agents such as those known as "anti-blocking agents," "slipping agents," "leveling agents," and "antifouling agents," among others, which induce a low surface free energy; a fluororesin based compound or a silicone resin based compound is preferably used, Examples of fluororesin based compounds include perfluoropolyether group-containing (meth)acrylates and perfluoroalkyl group-containing (meth)acrylates, among others; examples of silicone resin based compounds include (meth)acrylate containing polydimethylsiloxane and (meth)acrylate containing polyalkylsiloxane, among others. These May be used individually or in a combination of two or more. Among these, a perfluoropolyether group-containing (meth)acrylate is preferably used in view of solubility, among other considerations. Examples of commercially available products of a perfluoropolyether group-containing (meth)acrylate include, for example, trade name "KY-1203" (Shin-Etsu Chemical Co., Ltd.), among others. It should be noted that, in the present disclosure, (meth)acrylate is meant to include acrylic acid esters (acrylate) and methacrylic acid esters (methacrylate).

Content of the first compound in the resin composition is preferably 0.01 to 30 pts. mass and more preferably 0.1 to 10 pts. mass with respect to 100 pts. mass of the second compound because insufficient content cannot achieve the surface free energy difference pattern and excessive content tends to reduce surface free energy differences.

The second compound may be any compound so long as it induces a higher surface free energy than the first compound; examples thereof include monofunctional (meth)acrylate, bifunctional (meth)acrylate, and trifunctional or higher functional (meth)acrylate.

Examples of the monofunctional (meth)acrylate include polyalkylene glycol ester monomer and alkyl (meth)acrylate having a linear or branched alkyl group, among others. More particular examples of polyalkylene glycol ester monomers include hydroxyethyl (meth)acrylate, hydroxypropyl (meth)acrylate, polyethylene glycol mono(meth)acrylate, polypropylene glycol mono(meth)acrylate, polybutylene glycol mono(meth)acrylate, and polyethylene glycol polypropylene glycol mono(meth)acrylate, among others; these may be used individually or in a combination of two or more. Among these, polyethylene glycol mono(meth)acrylate can be preferably used in view of reactivity, crosslinking properties, and surface hardness, among other considerations. Examples of commercially available product of polyethylene glycol mono(meth)acrylate include, for example, trade name "AE-400" (NOF CORPORATION), among others.

More particular examples of bifunctional (meth)acrylate include tricyclodecane dimethanol di(meth)acrylate, dimethylol tricyclodecane di(meth)acrylate, EO-modified bisphenol A di(meth)acrylate, 1,9-nonanediol di(meth)acrylate, 1,10-decanediol di(meth)acrylate, 2-hydroxy-3-acryloyloxypropyl (meth)acrylate, propoxylated bisphenol A di(meth)acrylate, diethylene glycol di(meth)acrylate, neopentyl glycol di(meth)acrylate, 1,4-butanediol di(meth)acrylate, polyethylene glycol (200) di(meth)acrylate, tetraethylene glycol di(meth)acrylate, polyethylene glycol (400) di(meth)acrylate, cyclohexane dimethanol di(meth)acrylate, alkoxylated hexanediol di(meth)acrylate, alkoxylated cyclohexane dimethanol di(meth)acrylate, ethoxylated (4) bisphenol A di(meth)acrylate, ethoxylated (10) bisphenol A di(meth)acrylate, polyethylene glycol (600) di(meth)acrylate, alkoxylated neopentyl glycol di(meth)acrylate, dioxane glycol di(meth)acrylate, and EO-modified isocyanurate di(meth)acrylate, among others; these may be used individually or in a combination of two or more.

More particular examples of trifunctional or higher functional (meth)acrylates include pentaerythritol tri(meth)acrylate, propylene glycol modified glycerol triacrylate, EO-modified pentaerythritol tri(meth)acrylate, EO-modified isocyanurate tri(meth)acrylate, ε-caprolactone modified tris-(2-acryloxyethyl) isocyanurate, trimethylolpropane tri(meth)acrylate, ε-caprolactone modified tris(acryloxyethyl)(meth)acrylate, ethoxylated (20) trimethylolpropane tri(meth)acrylate, propoxylated (3) trimethylolpropane tri(meth)acrylate, propoxylated (6) trimethylolpropane tri(meth)acrylate, ethoxylated (9) trimethylolpropane tri(meth)acrylate, propoxylated (3) glyceryl tri(meth)acrylate, ethoxylated (4) pentaerythritol tetra(meth)acrylate, pentaerythritol tetra(meth)acrylate, ditrimethylolpropane tetra(meth)acrylate, dipentaerythritol penta(meth)acrylate, EO-modified dipentaerythritol penta(meth)acrylate, and dipentaerythritol hexa(meth)acrylate, among others; these may be used individually or in a combination of two or more. Among these, pentaerythritol tri(meth)acrylate and propylene glycol modified glycerol triacrylate can be preferably used in view of reactivity, crosslinking properties, and surface hardness, among other considerations. Examples of commercially available products of pentaerythritol tri(meth)acrylate include, for example, trade name "TMM-3" (SHIN-NAKAMURA CHEMICAL CO., LTD.), among others, and examples of commercially available products of propylene glycol modified glycerol triacrylate include trade name "OTA-480" (DAICEL-ALLNEX LTD), among others.

The second compound is preferably a combination of a monofunctional (meth)acrylate and a bifunctional or higher functional (meth)acrylate. Content of the bifunctional or higher functional (meth)acrylate in 100 pts. mass of the second compound is preferably 60 pts. mass or more and more preferably 80 pts. mass or more because insufficient content tends to degrade reactivity and crosslinking properties.

The photoinitiator can be selected for use as appropriate from among known photoradical polymerization initiators. Examples of the photoinitiator include α-hydroxyalkylphenone, benzyldimethylketal, and α-aminoalkylphenone, among others; these may be used individually or in a combination of two or more, More particular examples of commercially available photoinitiators include, as α-hydroxyalkylphenone, 1-hydroxycyclohexyl-phenyl-ketone (IRGACURE 184,BASF Japan Ltd.), 2-hydroxy-2-methyl-1-phenyl-propan-1-one (DAROCUR 1173,BASF Japan Ltd.) 1-[4-(2-hydroxyethoxy)-phenyl]-2-hydroxy-2-methyl-1-propan-1-one (IRGACURE 2959,BASF Japan Ltd.), and 2-hydroxy-1-{4-[4-(2-hydroxy-2-methyl-propionyl)-benzyl]-phenyl}-2-methyl-propan-1-one (IRGACURE 127,BASF Japan Ltd.), among others. Furthermore, examples of benzyl dimethyl ketal include 2,2-dimethoxy-1,2-diphenylethan-1-one (IRGACURE 651, BASF Japan Ltd.), among others. Furthermore, examples of α-aminoalkylphenone include 2-methyl-1-(4-methylthiophenyl)-2-morpholinopropan-1-one (IRGARCURE 907, BASF Japan Ltd.) and 2-benzyl-2-dimethylamino-1-(4-morpholinophenyl)-butanone-1 (IRGACURE 369,BASF Japan Ltd.), among others. Among these, 1-hydroxycyclohexyl-phenyl-ketone (IRGACURE 184,BASF Japan Ltd.) is preferably used in view of realizing easy photocuring.

Content of the photoinitiator in the resin composition is preferably 0.1 to 10 pts. mass and more preferably 1 to 10 pts. mass with respect to 100 pts. mass of the second compound because insufficient content tends to degrade curing performance, leading to degraded adhesive properties in addition to inadequate hardening, and excessive content tends to degrade properties such as adhesive properties due to defective polymerization.

Furthermore, so long as the effects of the present invention are not impaired, the resin composition may contain additives such as solvents, leveling agents, hue adjusting agents, coloring agents, ultraviolet absorbers, antistatic agents, and various thermoplastic resin materials, among others.

Figure 1:
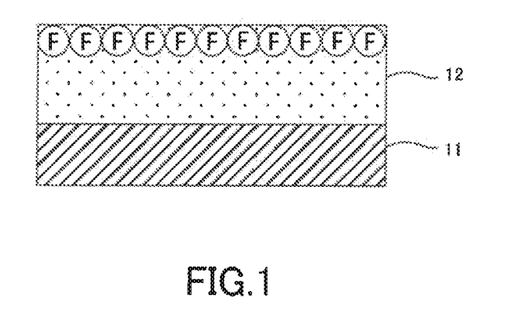
FIG. 1 is a cross-sectional view schematically illustrating a coating step of coating a resin composition onto a supporting film.

FIG. 1 is a cross-sectional view schematically illustrating a coating process of coating a resin composition onto a supporting film. For example, a bar coater, spray coater, or a spin coater can be used for applying.

The supporting film 11 is without particular limitation and PET (polyethylene terephthalate), glass, and polyimide, among other materials, can be used. Furthermore, either a transparent or opaque material can be used; however, using a material transparent to ultraviolet light allows irradiating ultraviolet light from the supporting film 11 side.

The resin composition 12, as described above, contains the first compound, the second compound, and the photoinitiator; the first compound exists on the surface. It should be noted that a fluororesin compound is illustrated in FIG. 1 as an example of the first compound; however, the present invention is not limited thereto.

Figure 2:
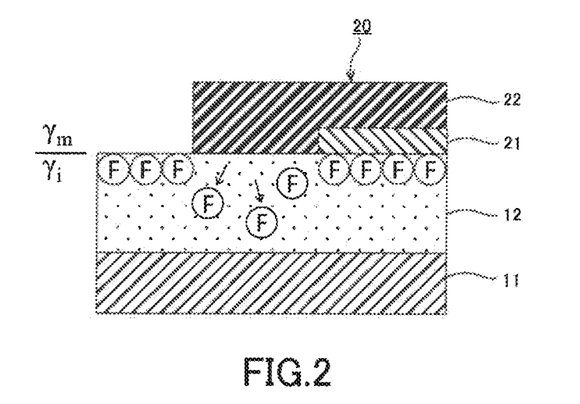
FIG. 2 is a cross-sectional view schematically illustrating a curing step in which a resin composition is brought into contact with a master to be cured.

Next, in the transferring step, the resin composition 12 is brought into contact with the master 20 and cured to obtain a base material having a surface free energy difference pattern of the master 20 transferred thereto.

FIG. 2 is a cross-sectional view schematically illustrating a curing process in which the resin composition is brought into contact with a master and cured. In this curing step, the resin composition 12 is brought into contact with the master 20, having a pattern formed of surface free energy differences, and cured to form a cured resin layer, to which the pattern of the master 20 is transferred, on the supporting film 11.

The master 20 has a high surface free energy region 21 and a low surface free energy region 22 on a surface thereof. The high surface free energy region 21 is a region of; for example, silicon, metal such as aluminum or copper, glass, silicon oxide, or metal oxides such as aluminum oxide, among others; the low surface free energy region 22 is a region of low surface free energy coating film such as, for example, a fluorine coating or a silicone-based coating or inert gas such as nitrogen or carbon dioxide gas. The material of the master 20 is preferably glass allowing easy fluorine coating. Furthermore, the surface of the master 20 is preferably smooth.

As illustrated in FIG. 2, when the master 20 is brought into contact with the resin composition 12, at an interface between the master 20 and the resin composition 12, because $\Delta\gamma$ represented in the following formula (1) tends to decrease, the first compound on the surface of the resin composition 12 moves to the low surface free energy region 21 of the master 20 and the second compound moves to the high surface free energy region 22. It should be noted that a fluororesin compound is illustrated in FIG. 2 as an example of the first compound; however, the present invention is not limited thereto.

$$\Delta\gamma = \gamma_m - \gamma_i \quad (1)$$

In the above formula (1), $\gamma_m$ is the surface free energy of the surface of the master 20 and $\gamma_i$ is the surface free energy of the surface of the resin composition 12.

By curing the resin composition 12 in a state in which the master 20 is in contact with the resin composition 12, it is possible to obtain, on the supporting film 11, a base material 13 comprising the cured resin layer to which the pattern of the master 20 is transferred. Methods for curing the resin composition 12 can he selected as appropriate according to the type of resin, and irradiation of energy such as heat or ultraviolet light, among others, can be used.

Figure 3:
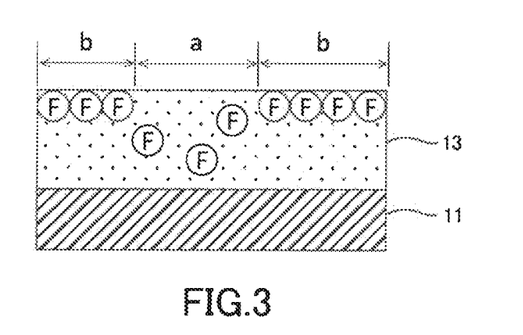
FIG. 3 is a cross-sectional view illustrating an example of a base material to which a pattern has been transferred.

FIG. 3 is a cross-sectional view illustrating an example of a base material to which the pattern has been transferred. It should be noted that a fluororesin compound is illustrated in FIG. 3 as an example of the first compound; however, the present invention is not limited thereto.

In the base material 13, the surface of the cured resin layer has a pattern of a high surface free energy region a and a low surface free energy region b. The base material 13 is obtained by curing the resin composition containing the first compound which induces a low surface free energy and the second compound which induces a higher surface free energy than the first compound, and the base material 13 has the high surface free energy region a and the low surface free energy region h on the surface thereof. Furthermore, the high surface free energy region a and the low surface free energy region b have optically smooth surfaces, and a height difference therebetween is preferably less than several tens of nanometers.

A difference in surface free energy between the high surface free energy region a and the low surface free energy region b is preferably 10 mJ./cm$^2$ or more, and more preferably 20 mJ/cm$^2$ or more. More particularly, it is preferable that the surface free energy of the high surface free energy region a is 20 to 60 mJ/cm$^2$ and the surface free energy of the low surface free energy region b is 10 to 25 mJ/cm$^2$. Thereby, a conductive coating composition can be selectively applied to the high surface free energy region a or the low surface free energy region b.

Conductive Pattern Forming Step

In the conductive pattern forming step, the conductive coating composition is applied to the pattern transfer surface of the base material to form the conductive pattern. The conductive pattern is selectively formed in the high surface free energy portion or the low surface free energy portion.

Examples of coating methods for the conductive coating composition include dip coating, spin coating, flow coating, spray coating, and squeegee methods, among others; among these, dip coating having a convenient setup is preferably use.

The conductive coating composition is selectively applied to the high surface free energy region or the low surface free energy region on the surface of the base material and is made into a conductive pattern by, for example, drying, heating, or baking, among other methods. Examples of usable conductive coating compositions include, for example, ti compositions known as conductive inks or metal inks in which metal particles having I to 100 nm particle diameters are dispersed at a high concentration in a solvent. Examples of the metal particles include conductive metals such as silver, gold, copper, nickel, and palladium, among others; among these, silver having high conductivity is preferably used. Furthermore, it is preferable that the conductive coating composition contains an organic compound (ligand) and the dispersing force of the ligand is used to dissolve the metal particles in the solution. As a solvent, from the viewpoint of solubility of the ligand, it is preferable to use a polar solvent such as water, methanol, or ethanol, among others, and the conductive coating composition preferably exhibits hydrophilic properties. Examples of commercially available products of the conductive coating composition include, for example,"TEC-PR-010" (InkTec Co., Ltd.), "TEC-IJ-010" (InkTec Co., Ltd.), and "DryCure Ag" (COLLOIDAL INK Co., Ltd.), among others.

In such a conductive pattern forming step, by using the base material having the surface free energy difference pattern on the surface thereof, by applying the conductive coating composition, selective application occurs as intended, and a wiring pattern having excellent fine pitch and dimensional stability can be drawn in a simple and easy manner.

Furthermore, the conductive pattern forming step does not require such complicated processes as exposure processes using photomask car photoresist steps; furthermore, other steps such as peeling off excess conductive coating composition are also not required. It is thus possible to obtain a conductive pattern having a required amount of the conductive coating composition.

2. Wiring Board wiring board according to one embodiment of the present invention includes a base material having a pattern of a high surface free energy region and a low surface free energy region, and a conductive pattern formed on the high surface free energy region.

Figure 4:
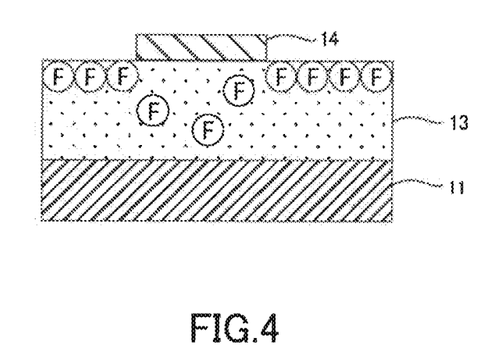
FIG. 4 is a cross-sectional view illustrating an example of a wiring board on which a conductive pattern is formed on a surface of a base material.

FIG. 4 is a cross-sectional view showing an example of a wiring board on which a conductive pattern is formed on a surface of the base material. As shown in FIG. 4, the wiring board has, on a supporting film 11, a base material 13 having a low surface free energy region and a high surface free energy region on the surface thereof, and a conductive pattern 14 formed on the high surface free energy region. It should be noted that a fluororesin compound is illustrated in FIG. 4 as an example of the first compound; however, the present invention is not limited thereto. Furthermore, because the supporting film 11 and the base material 13 are the same as the supporting film 11 and the base material 13 illustrated in FIGS. 1 to 3, further description thereof will be omitted.

The conductive pattern is formed by the conductive coating composition being affixed to the high surface free energy region on the surface of the base material 13 by drying, heating, or baking, among other methods.

Further, the conductive pattern is formed on the high surface free energy region, and the surface free energy of the low surface free energy region where the conductive pattern is not formed is preferably 10 to 25 mJ/cm$^2$. Thereby, the conductive coating composition does not remain between wiring, thus enabling prevention of short-circuits between the wiring. Accordingly, the wiring board according to the present embodiment is very useful in the field of electronics, for example, in electronic circuit patterns.

EXAMPLES

4. Examples

Hereinafter, examples of the present invention will be described in detail. In the present examples, conductive patterns were manufactured by bringing a resin composition containing a first compound inducing a low surface free energy and a second compound inducing a high surface free energy higher than the first compound into contact with a master having a desired surface free energy difference pattern formed thereon and curing to obtain a base material to which the surface free energy difference pattern was transferred, the conductive pattern was then formed by applying a conductive coating composition onto a surface of pattern transfer of the base material. The conductive patterns were then observed with an optical microscope and an AFM (Atomic Force Microscope). It should be noted that the present invention is not limited to these examples.

For the microscope and AFM (Atomic Force Microscope), the following devices were used.

Microscope: VE-IX-1000 (manufactured by KEYENCE CORPORATION)

AFM: SPA 400 (manufactured by Hitachi High-Tech Science Corporation)

The masters and the base materials were prepared as follows.

Master Production

First, a negative photoresist (trade name: OFPR-800LB, manufactured by TOKYO OHKA KOGYO CO., LTD.) was applied by spin coating to 10 cm×10 cm glass substrates which were then dried on a hot plate at 110° C. for 90 seconds. The photoresist coated substrates and photomasks A to C patterned with the following patterns were positioned before exposing with an exposure device A (Mask Aligner MA-20,MIKASA CO., LTD.).

Photomask A: 5 μm lines and spaces
Photomask B: 5 μm dot pitch
Photomask C: 0.5 μm lines and spaces After exposure, these substrates were developed by immersing in an aqueous solution of 2.38% tetramethylammonium hydroxide for one minute before immersing in pure water for one minute and drying at room temperature. The developed substrates were first washed with pure water and then a cleaning liquid (Novec 7300, 3M) before applying a fluorine coating agent (DURASURF DS-5200,HARVES Co., Ltd.) by drop casting. After leaving to stand overnight, the developed substrates were washed with the cleaning liquid (Novec 7300, 3M) before applying the fluorine coating agent (DURASURF DS-5200,HARVES Co., Ltd.) by drop casting. After leaving to stand overnight again, the developed substrates were washed with the cleaning liquid (Novec 7300, 3M) and dried at room temperature. These substrates were immersed in a stripping liquid for five minutes to remove remaining resist film before washing first with acetone and then with the cleaning liquid (Novec 7300, 3M). Masters A to C were thus obtained having a patterning of high surface free energy regions and low surface free energy regions (i.e. having fluorine coating portions) on the glass substrates.

Figure 5:
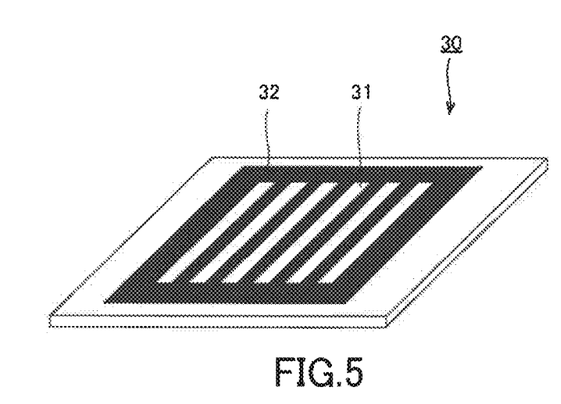
FIG. 5 is a perspective view schematically illustrating a master A.

FIG. 5 is a perspective view schematically illustrating the master A. As illustrated in FIG. 5, a master A 30 had a low surface free energy region 31 and a high surface free energy region 32 patterned with 5 μm lines and spaces (hereinafter referred to as 5 μm L&S) of the photomask A. Furthermore, a master B had a high surface free energy region patterned with a 5 μm dot pitch (hereinafter referred to as 5 μm dots) of the photomask B. Furthermore, a master C had a high surface free energy region patterned with 0.5 μm lines and spaces (hereinafter referred to as 0.5 μm L&S) of the photomask C.

Base Material Production

A resin composition was prepared by adding 80 pts. mass of TMM-3L, 15 pts. mass of OTA-480, 5 pts. mass of AE-400, 1 pts. mass of KY-1203,and 3 pts. mass of IRGACURE 184.

TMM-3L (SHIN-NAKAMURA CHEMICAL CO., LTD): pentaerythritol triacrylate

OTA-480 (DAICEL-ALLNEX LTD.): propylene glycol modified glycerol triacrylate

AE-400 (NOF CORPORATION): polyethylene glycol monoacrylate #400

KY-1203 (Shin-Etsu Chemical Co., Ltd.): perfluoropolyether-containing acrylate

IRGACURE 184 (BASF Japan Ltd.): 1-hydroxy-cyclohexyl-phenyl-ketone

Figure 6:
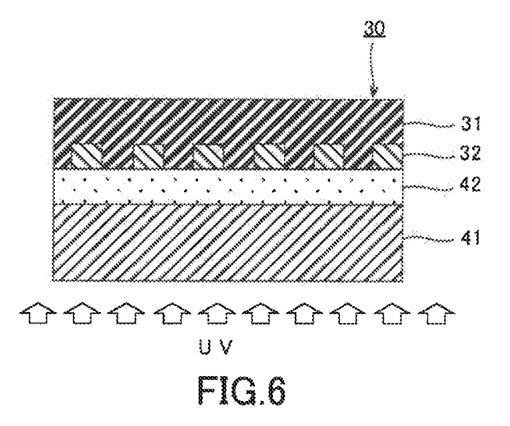
FIG. 6 is a cross-sectional view schematically illustrating a transferring step of transferring a pattern of a master A.

FIG. 6 is a cross-sectional view schematically showing a transferring step of transferring the pattern of the master A. As illustrated in FIG. 6, the resin composition 42 was coated on a PET film 41 using a bar coater (at a wet film thickness of 8 μm), brought into close contact with a patterning master 30, and photocured by exposing to light using an exposure device B (alignment exposure device, TOSHIBA Lighting & Technology Corporation) from the PET surface side. In the above, radiant exposure was 6 J/cm$^2$. Masters A to C were peeled from the surface of the cured resin layer to obtain, on PET films, base materials A to C to which the surface free energy of the masters A to C had been transferred.

Furthermore, a master D having an entire surface uncoated by the fluorine coating and a master E having an entire surface coated by the fluorine coating were used to evaluate the surface free energies of the high surface free energy regions and the low surface free energy regions of the base material A to which the 5 μm L&S of the master A had been transferred, the base material B to which the 5 μm dots of the master B had been transferred, and the base material C to which the 0.5 μm L&S of the master C had been transferred.

A 10 cm×10 cm glass substrate was washed first with pure water and then the cleaning liquid (Novec 7300, 3M) to obtain the master D. Then, using the master D, the above-described resin composition was photocured to obtain a base material D, an entire surface of which was a high surface free energy region.

Then, a 10 cm×10 cm glass substrate was washed first with pure water and then with the cleaning liquid (Novec 7300, 3M) before applying a fluorine coating agent (DURASURF DS-5200,HAM/ES Co., Ltd.) by drop casting. After leaving to stand overnight, the substrate was washed with the cleaning liquid (Novec 7300, 3M) before applying the fluorine coating agent (DURASURF DS-5200,HARVES Co., Ltd.) by drop casting. After leaving to stand overnight again, further washing was performed with the cleaning liquid (Novec 7300, 3M) before drying at room temperature. This substrate was then washed first with acetone and then with the cleaning liquid (Novec 7300, 3M). A. master E having a fluorine coating on the entire surface thereof was thus obtained. Then, using the master E, the above-described resin composition was photocured to obtain a base material E, an entire surface of which was a low surface free energy region.

Surface free energies of the base material D and the base material E were measured using a contact angle meter (DM-701,Kyowa interface Science Co., Ltd) and calculated using the Kaelble and Wu methods. Results were a surface free energy of 51.3 mJ/cm$^2$ for the base material D and a surface free energy of 16.7 mJ/cm$^2$ for the base material E.

Example 1

As the conductive coating composition, trade name "TEC-FR-010" (metal: Ag, metal content: 10%, viscosity 100-800 Pa·S, appearance: colorless and transparent) of TnkTec Co., Ltd., was used. The conductive coating composition was filled into a sample container and the base materials A to C were dipped and vertically withdrawn at a speed of 1 cm/min. After withdrawing, the base materials were dried on a hot plate at 120° C. for five minutes. These operations were performed five times to form conductive patterns on the base materials A to C.

Figure 7:
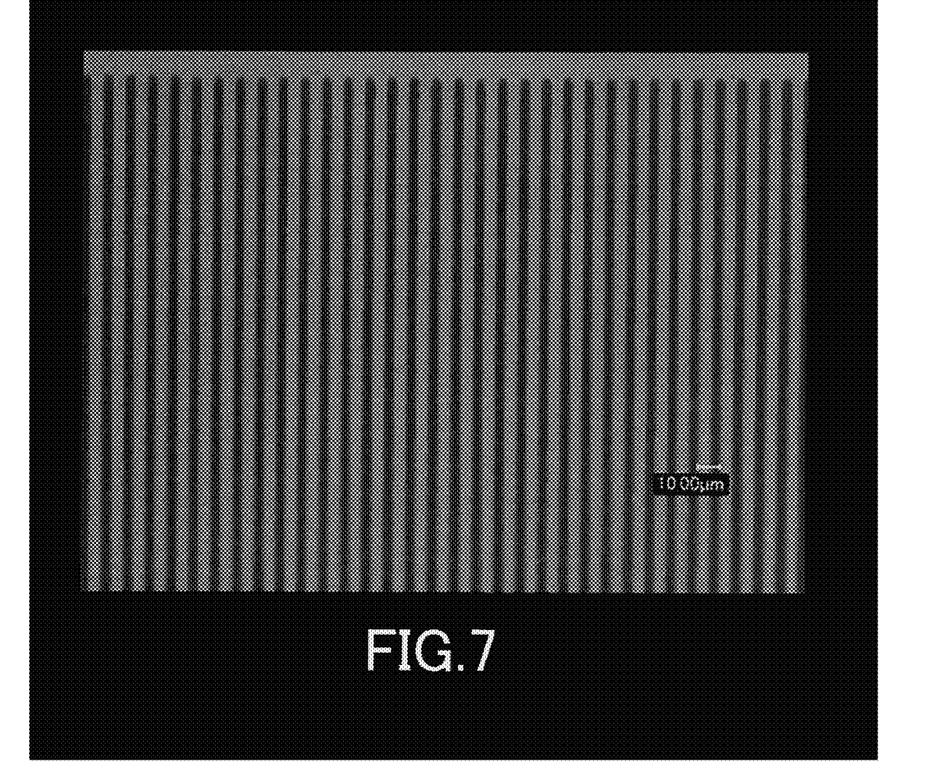
FIG. 7 is an image of a conductive pattern formed on a base material A in Example 1 observed by an optical microscope.
Figure 8:
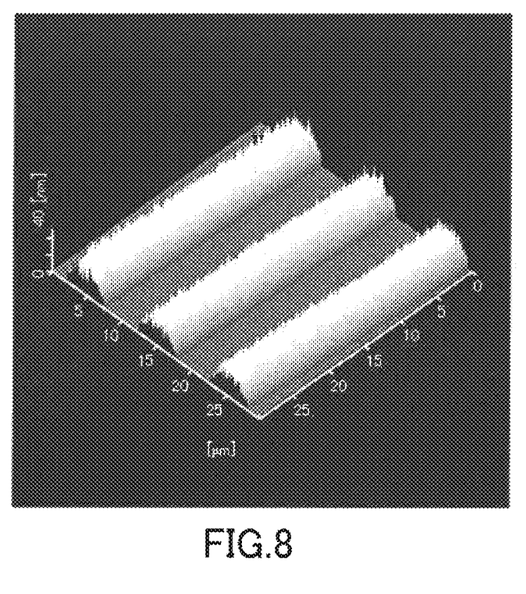
FIG. 8 is an image of a conductive pattern formed on a base material A in Example 1 observed by an AFM.

FIG. 7 is an image of the conductive pattern formed on the base material A observed by the optical microscope, and FIG. 8 is an image of the conductive pattern formed on a base material A observed by the AFM. From FIGS. 7 and 8, it was confirmed that the conductive coating composition was selectively applied only to the high surface free energy portions, and a 5 μm Ag wiring was formed. The Ag wiring had a height of approximately 20 nm. Furthermore, it was confirmed that the conductive coating composition had not adhered to the low surface free energy portions.

Figure 9:
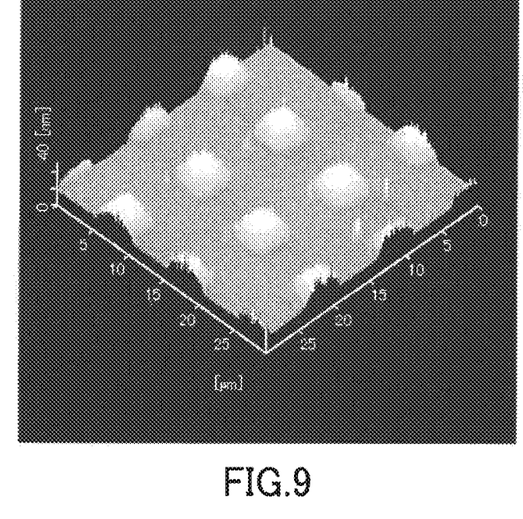
FIG. 9 is an image of a conductive pattern formed on a base material B in Example 1 observed by an AFM.

FIG. 9 is an image of the conductive pattern formed on the base material B observed by the AFM. From FIG. 9, it was confirmed that the conductive coating composition was selectively applied only to the high surface free energy portions, and a dot-shaped 5 μm Ag wiring was formed. The Ag wiring had a height of approximately 20 nm. Furthermore, it was confirmed that the conductive coating composition had not adhered to the low surface free energy portions.

Figure 10:
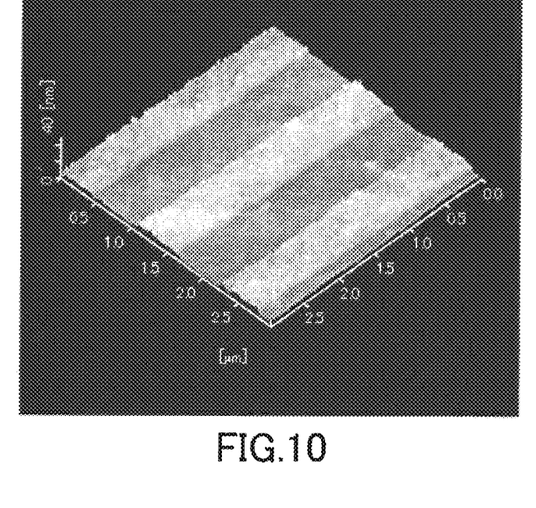
FIG. 10 is an image of a conductive pattern formed on a base material C in is Example 1 observed by an AFM.

FIG. 10 is an image of a conductive pattern formed on a base material C observed by the AFM. From FIG. 10, it was confirmed that the conductive coating composition was selectively applied only to the high surface free energy portions, and a 0.5 μm Ag wiring was formed. The Ag wiring had a height of approximately 10 nm. Furthermore, it was confirmed that the conductive coating composition had not adhered to the low surface free energy portions.

Example 2

As the conductive coating composition, trade name "TEC-IJ-010" (metal: Ag, metal content: 15%, surface tension: 30-32 mN/m, viscosity 9-15 Pa·S, appearance: light yellow transparent) of InkTec Co., Ltd., was used. Other than the above exception, a conductive pattern was formed on the base materials A to C as in Example 1.

Figure 11:
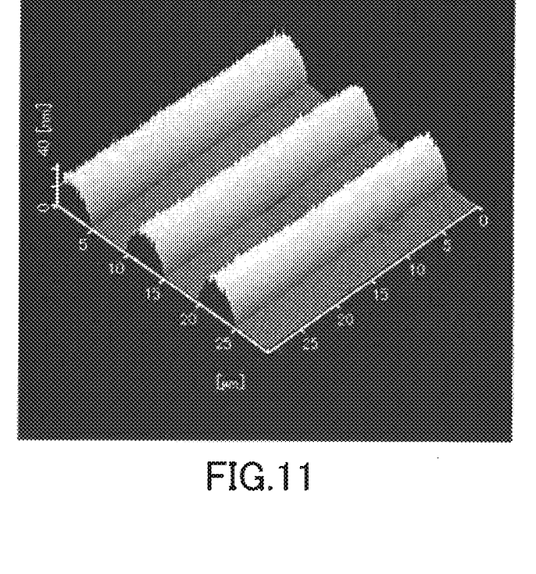
FIG. 11 is an image of a conductive pattern formed on a base material A in Example 2 observed by an AFM.

FIG. 11 is an image of the conductive pattern formed on the base material A observed by the AFM. From FIG. 11, it was confirmed that the conductive coating composition was selectively applied only to the high surface free energy portions, and a 5 μm Ag wiring was formed. The Ag wiring had a height of approximately 30 nm. Furthermore, it was confirmed that the conductive coating composition had not adhered to the low surface free energy portions.

Figure 12:
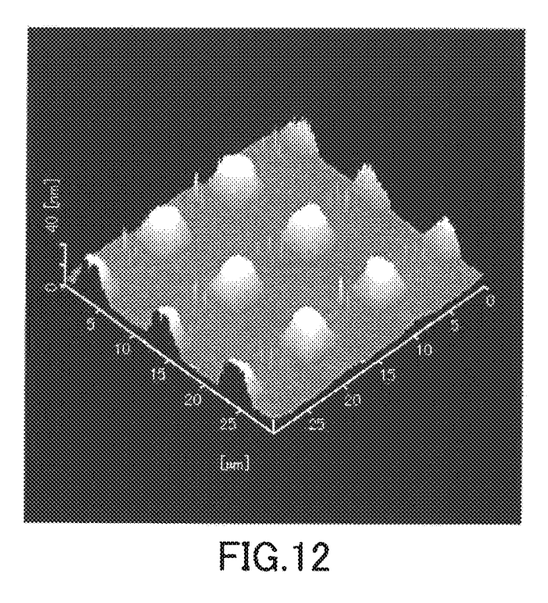
FIG. 12 is an image of a conductive pattern formed on a base material B in Example 2 observed by an AFM.

FIG. 12 is an image of the conductive pattern formed on the base material B observed by the AFM. From FIG. 12, it was confirmed that the conductive coating composition was selectively applied only to the high surface free energy portions, and a dot-shaped 5 μm Ag wiring was formed. The Ag wiring had a height of approximately 30 nm. Furthermore, it was confirmed that the conductive coating composition had not adhered to the low surface free energy portions.

Figure 13:
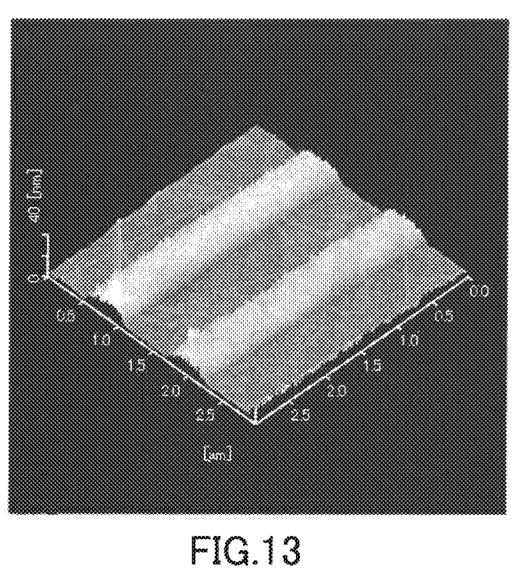
FIG. 13 is an image of a conductive pattern formed on a base material C in Example 2 observed by an AFM.

FIG. 13 is an image of the conductive pattern formed on the base material C observed by the AFM. From FIG. 13, it was confirmed that the conductive coating composition was selectively applied only to the high surface free energy portions, and a 0.5 μm Ag wiring was formed. The Ag wiring had a height of approximately 10 nm. Furthermore, it was confirmed that the conductive coating composition had not adhered to the low surface free energy portions.

REFERENCE SIGNS LIST 11 supporting film, 12 resin composition, 13 base material, 14 conductive pattern, 20 master, 21 low surface free energy region, 22 high surface free energy region, 30 glass substrate, 31 low surface free energy region, 32 high surface free energy region, 41 PET film, 42 resin composition

The invention claimed is:

1. A method for manufacturing a wiring board comprising:
   a transferring step of bringing a resin composition containing a first compound inducing a low surface free energy and a second compound inducing a high surface free energy which is higher than the first compound into contact with a master on which a desired surface free energy difference pattern is formed and curing to obtain a base material to which the surface free energy difference pattern is transferred; and
   a conductive pattern forming step of applying a conductive coating composition onto a surface of pattern transfer of the base material to form a conductive pattern,
   wherein the resin composition is an acrylic resin composition,
   wherein the first compound is a perfluoropolyether group-containing (meth)acrylate,
   wherein the base material has a pattern of a high surface free energy region and a low surface free energy region,
   wherein the high surface free energy region has a surface free energy of 20 to 60 mJ/cm$^2$, and
   wherein the low surface free energy region has a surface free energy of 10 to 25 mJ/cm$^2$.

2. The method for manufacturing a wiring board according to claim 1, wherein the conductive coating composition contains silver.

3. A wiring board comprising:
   a base material having a pattern of a high surface free energy region and a low surface free energy region; and
   a conductive pattern formed only on the high surface free energy region,
   wherein the conductive pattern is formed on the high surface free energy region,
   wherein the low surface free energy region is formed from a compound containing a perfluoropolyether group-containing (meth)acrylate,
   wherein the high surface free energy region has a surface free energy of 20 to 60 mJ/cm$^2$, and
   wherein the low surface free energy region has a surface free energy of 10 to 25 mJ/cm$^2$.

* * * * *